(12) United States Patent
Naono (10) Patent No.: US 8,400,055 B2
(45) Date of Patent: Mar. 19, 2013

(54) ORGANIC ELECTROLUMINESCENCE APPARATUS WITH METAL AUXILIARY WIRING

(75) Inventor: Hideaki Naono, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 107 days.

(21) Appl. No.: 12/413,060

(22) Filed: Mar. 27, 2009

(65) Prior Publication Data

US 2009/0256470 A1  Oct. 15, 2009

(30) Foreign Application Priority Data

Apr. 15, 2008  (JP) ................................ 2008-105409

(51) Int. Cl.
*H01J 1/62* (2006.01)
*H01J 63/04* (2006.01)

(52) U.S. Cl. ......... 313/504; 313/503; 313/506; 313/512

(58) Field of Classification Search .......... 313/498–512, 313/112, 113
See application file for complete search history.

(56) References Cited

U.S. PATENT DOCUMENTS

| 6,969,948 | B2 | 11/2005 | Urabe et al. |
| 6,971,938 | B2 | 12/2005 | Urabe et al. |
| 7,622,865 | B2 | 11/2009 | Kobayashi |
| 7,812,523 | B2 | 10/2010 | Jung et al. |
| 7,994,704 | B2 | 8/2011 | Kobayashi |
| 8,129,712 | B2 | 3/2012 | Nishikawa et al. |
| 2003/0048072 | A1* | 3/2003 | Ishihara et al. ............... 313/506 |
| 2003/0107314 | A1* | 6/2003 | Urabe et al. ................. 313/506 |
| 2004/0160167 | A1* | 8/2004 | Arai et al. .................... 313/500 |
| 2005/0035708 | A1* | 2/2005 | Yamazaki et al. ............ 313/505 |
| 2005/0104508 | A1* | 5/2005 | Ozawa et al. ................. 313/500 |
| 2005/0212407 | A1* | 9/2005 | Matsusue ..................... 313/503 |
| 2005/0236950 | A1* | 10/2005 | Maeda et al. ................ 313/112 |
| 2007/0241665 | A1* | 10/2007 | Sakanoue et al. ............ 313/503 |
| 2012/0112234 | A1 | 5/2012 | Nishikawa et al. |

FOREIGN PATENT DOCUMENTS

| CN | 1426269 A | 6/2003 |
| JP | 2002-157929 | 5/2002 |
| JP | A-2006-080094 | 3/2006 |
| JP | 2006-236947 | 9/2006 |
| JP | 2007-095515 | 4/2007 |
| JP | 2007-141844 | 6/2007 |
| JP | 2007-531297 | 11/2007 |
| JP | 2007-335347 | 12/2007 |
| WO | WO 2005/096407 A1 | 10/2005 |

* cited by examiner

*Primary Examiner* — Anh Mai
*Assistant Examiner* — Kevin Quarterman
(74) *Attorney, Agent, or Firm* — Oliff & Berridge, PLC (57) ABSTRACT

An organic electroluminescence apparatus includes a support substrate having a pixel region; a plurality of pixels; organic electroluminescence devices each having at least a first electrode layer, an emission layer, and a translucent second electrode layer; and an auxiliary wiring layer having a stripe-like pattern or a grid-like pattern. The apparatus emits light emitted from the organic electroluminescence device from the side where the second electrode layer is disposed, the second electrode layer is disposed over the entire or approximately the entire pixel region, and the auxiliary wiring layer is formed of a metal layer having a thickness capable of achieving translucency and is disposed so as to, in the plan view, overlap at least part of the organic electroluminescence device of each of the plurality of the pixels.

12 Claims, 10 Drawing Sheets

ORGANIC ELECTROLUMINESCENCE APPARATUS WITH METAL AUXILIARY WIRING

BACKGROUND

1. Technical Field

The present invention relates to an organic electroluminescence apparatus (hereinafter, referred to as organic EL apparatus) having organic electroluminescence devices (hereinafter, referred to as organic EL devices) on a support substrate.

2. Related Art

The organic EL apparatus has a structure having a pixel region where a plurality of pixels are arranged on a support substrate and each of the pixels is provided with at least a first electrode layer, an emission layer, and a second electrode layer to form an organic EL device. In such an organic EL apparatus, the second electrode layer is formed of a thin film so as to cover a plurality of pixels. Therefore, when the second electrode layer has high electric resistance or electric resistance varies depending on the region, a variation in brightness occurs in the organic EL apparatus. In particular, in a top-emission organic EL apparatus wherein light emitted from the organic EL devices is emitted from the side (the opposite side of the side where the support substrate is disposed) where the second electrode layer is disposed, the second electrode layer is required to have translucency. Accordingly, the second electrode layer is decreased in thickness, and thereby a variation in brightness caused by the electric resistance of the second electrode layer readily occurs.

Figure 10:
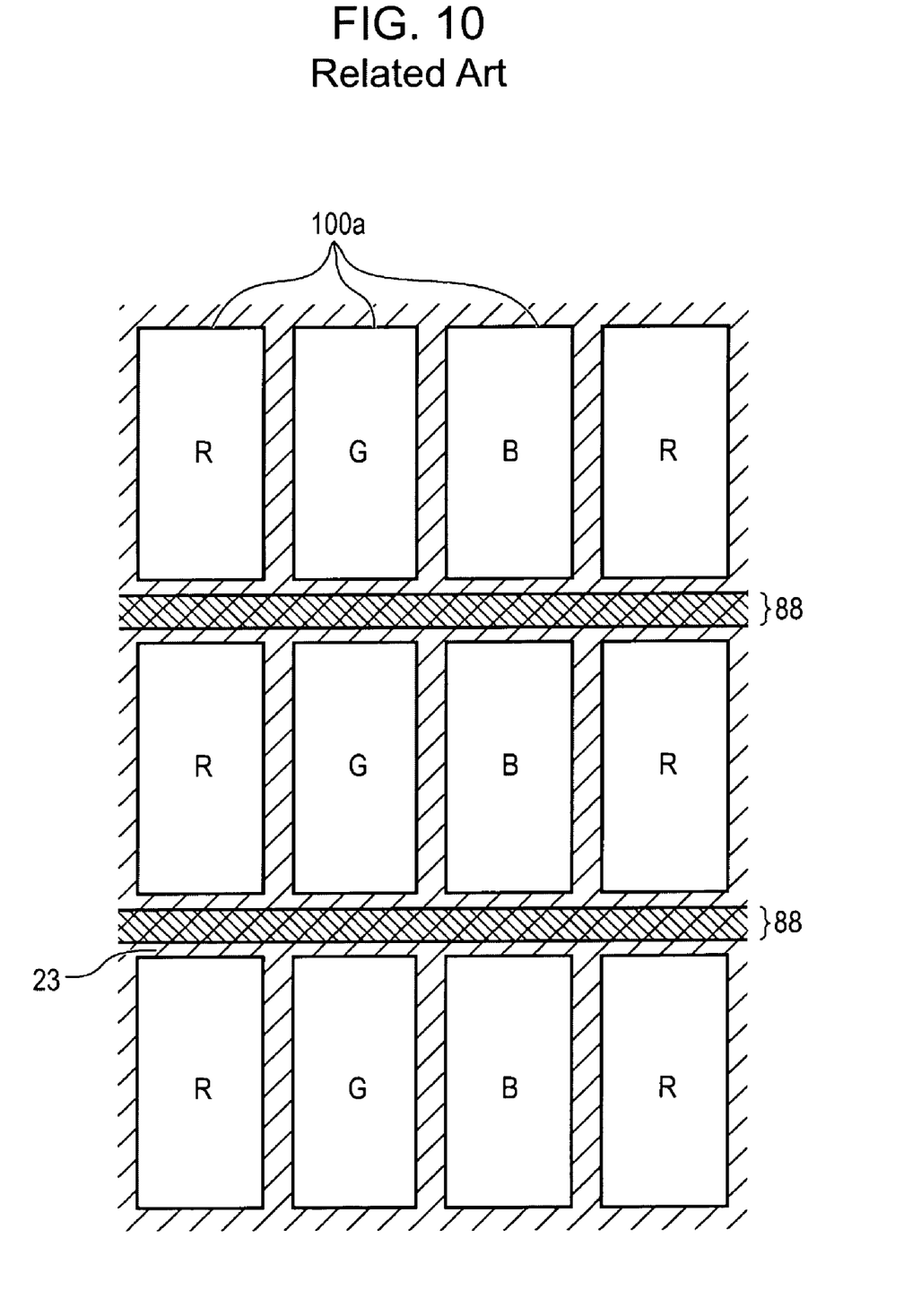
FIG. 10 is a plan view illustrating a positional relationship between the auxiliary wiring layer and the pixels in a known organic EL apparatus.

Accordingly, it is proposed to prevent the variation in brightness caused by the electric resistance of the second electrode layer by disposing an auxiliary wiring layer of a metal film, such as aluminum, such that the auxiliary wiring layer is in contact with the upper side or the lower side of the second electrode layer. In such a technology, for example, as shown in FIG. 10, the auxiliary wiring layer 88 extends between adjacent pixels 100a not to interrupt the light emitted from the organic EL devices (see Patent Document 1: JP-A-2006-80094).

However, in the structure described in Patent Document 1, a sufficient space is necessary for disposing the auxiliary wiring layer 88 between the adjacent pixels 100a, and, therefore, the pixels are necessarily decreased in size. In addition, when a substrate provided with organic EL devices and a translucent substrate provided with color filters so as to oppose each other for color display, in many cases, a light-shielding layer 23 is disposed, in the plan view, in a region between adjacent pixels in order to prevent, for example, color mixing. In these cases, the light-shielding layer 23 necessarily has a large width such that the auxiliary wiring layer 88 does not protrude from the light-shielding layer 23. As a result, it is caused a disadvantage that the ratio of the light emission region occupying in the pixel 100a (pixel aperture ratio) is decreased.

SUMMARY

An advantage of some aspects of the invention is that it provides an organic EL apparatus that does not require to broaden the width of the region between adjacent pixels even if an auxiliary wiring layer is disposed.

In order to solve the above-mentioned disadvantages, the invention provides an organic electroluminescence apparatus including a support substrate having a pixel region on one surface thereof; a plurality of pixels arranged in the pixel region; organic electroluminescence devices each having at least a first electrode layer, an emission layer, and a translucent second electrode layer stacked in this order in each of the plurality of the pixels; and an auxiliary wiring layer having a stripe-like pattern or a grid-like pattern and disposed on the upper side or the lower side of the second electrode layer so as to be in contact with the second electrode layer, wherein light emitted from the organic electroluminescence device is emitted from the side where the second electrode layer is disposed; the second electrode layer is disposed over the entire or approximately the entire pixel region; and the auxiliary wiring layer is formed of a metal layer having a thickness capable of achieving translucency and is disposed so as to, in the plan view, overlap at least part of the organic electroluminescence device of each of the plurality of the pixels.

In the invention, the auxiliary wiring layer is formed of a metal layer such as a silver layer or a silver alloy layer and has a small thickness that can achieve translucency. Therefore, the amount of emission light is not significantly decreased by forming the auxiliary wiring layer so as to, in the plan view, overlap the pixels. Consequently, it is not necessary to dispose the auxiliary wiring layer between the adjacent pixels, resulting in no need to spare a broad space between the adjacent pixels. As a result, the pixels can be increased in size.

In the invention, the auxiliary wiring layer is preferably formed of a silver layer or a silver alloy layer.

In the invention, a structure having a translucent substrate disposed so as to face the one surface of the support substrate can be employed.

In this case, the translucent substrate can be provided with a light-shielding layer having a stripe-like pattern or a grid-like pattern in a region, in the plan view, between the adjacent pixels. Furthermore, in this case, in the plan view, the auxiliary wiring layer may overlap the light-shielding layer. Accordingly, the light-shielding layer can have a small width, and, therefore, the ratio of the light emission region occupying in a pixel (pixel aperture ratio) can be high.

In the organic EL apparatus applied with the invention, light having different colors can be emitted from a plurality of the pixels by employing, for example, a translucent substrate provided with color filters having different colors in a region, in the plan view, overlapping the plurality of the pixels. In addition, the plurality of the organic EL devices may be configured so as to emit light having different colors.

In the invention, it is preferred that the auxiliary wiring layer configure a half mirror layer that configures an optical resonator between the half mirror layer and a light reflection face arranged on the support substrate side with respect to the auxiliary wiring layer. With such a configuration, the color purity of light emitted from each pixel is increased, resulting in display of a color image with high quality.

In the invention, it is preferable that a half mirror layer of a metal layer be disposed on the upper side or the lower side of the second electrode layer so as to be in contact with the second electrode layer; in the plan view, overlap at least part of the organic EL device in each of the plurality of the pixels; and configure an optical resonator between the half mirror layer and the light reflection face arranged on the support substrate side with respect to the half mirror layer. Such a structure can increase color purity of light emitted from each pixel, resulting in display of a color image with high quality. In addition, since the half mirror layer is formed of a metal layer, it can achieve the same function as that of the auxiliary wiring layer. In this case, the half mirror layer is preferably formed of a silver layer, a silver alloy layer, an aluminum layer, or an aluminum alloy layer.

In the invention, it may be employed a structure that the areas where the half mirror layer, in the plan view, overlaps the organic EL devices differ from each other according to the color at the corresponding pixel.

The organic EL apparatus applied with the invention is used as a direct-viewing-type display in an electronic apparatus such as a mobile phone or a mobile computer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described. In the drawings referred in the description below, the scales of the layers and members are different in order that each layer and member has a size capable of being identified in the drawings.

First Embodiment

Entire Structure

Figure 1:
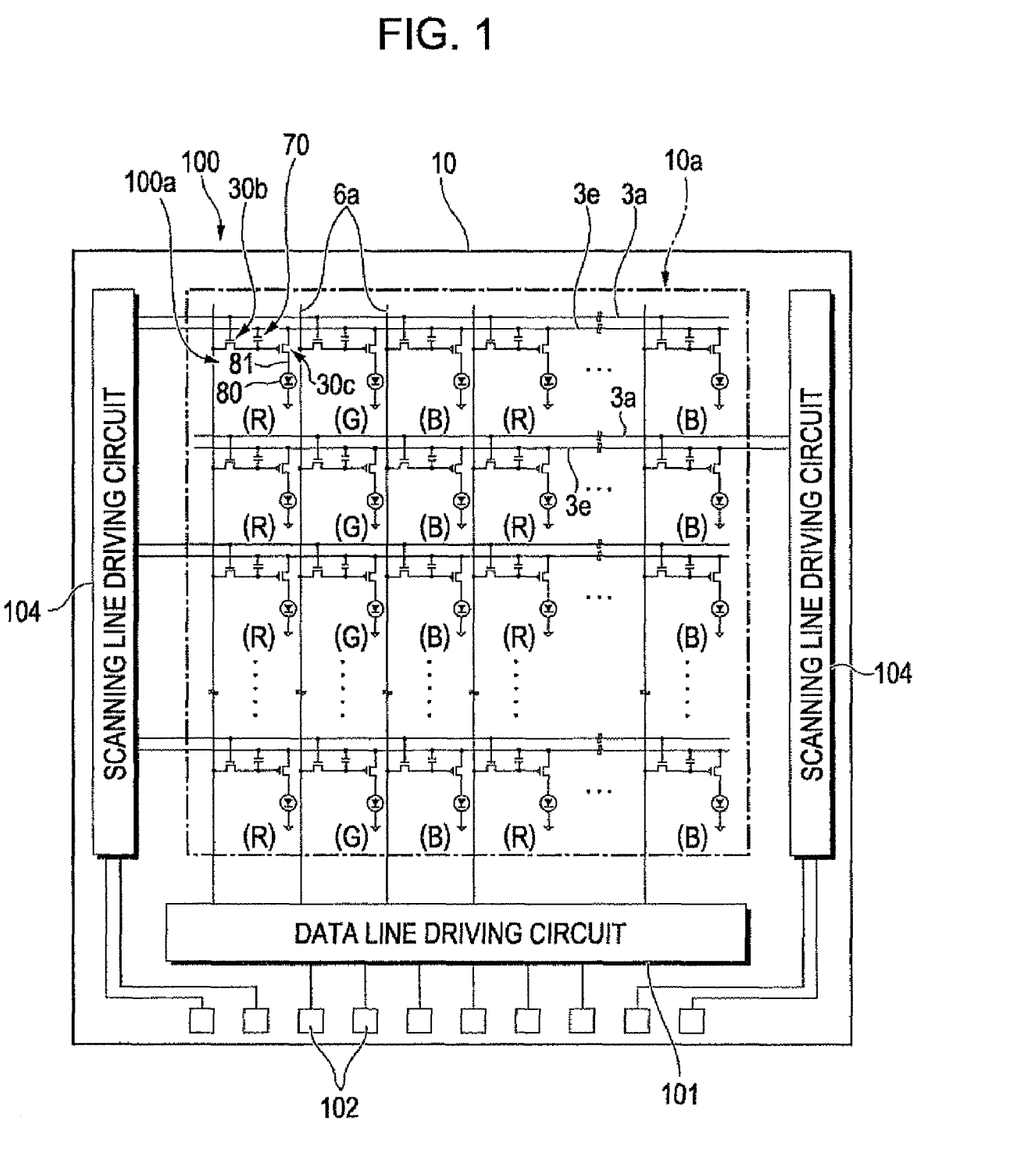
FIG. 1 is an equivalent circuit diagram illustrating the electrical structure of an organic EL apparatus applied with the invention.

FIG. 1 is an equivalent circuit diagram illustrating the electric structure of an organic EL apparatus applied with the invention. In the organic EL apparatus 100 shown in FIG. 1, a plurality of scanning lines 3*a*, a plurality of data lines 6*a* extending in the direction intersecting the scanning lines 3*a*, and a plurality of power source lines 3*e* extending in the direction parallel to the scanning lines 3*a* are disposed on a first substrate 10. Furthermore, a plurality of pixels 100*a* is arranged in a matrix in a rectangular pixel region 10*a* on the first substrate 10. The data lines 6*a* are connected to a data line driving circuit 101, and the scanning lines 3*a* are connected to a scanning line driving circuit 104. Each pixel 100*a* is provided with a switching thin film transistor 30*b* to supply of scanning signals to a gate electrode via the scanning line 3*a*, a storage capacitor 70 to store pixel signals supplied from the data line 6*a* via this switching thin film transistor 30*b*, a driving thin film transistor 30*c* to supply pixel signals stored in the storage capacitor 70 to the gate electrode, a first electrode layer 81 (anode layer) into which a driving current is fed from the power source line 3*e* when the first electrode layer is electrically connected to the power source line 3*e* via the driving thin film transistor 30*c*, and an organic EL device 80 composed of this first electrode layer 81, a cathode layer, and an organic functional layer disposed between the first electrode layer 81 and the cathode layer.

According to such a structure, when the scanning line 3*a* is driven and the switching thin film transistor 30*b* is turned on, the potential of the data line 6*a* at that time is stored in the storage capacitor 70 and the on or off state of the driving thin film transistor 30*c* is determined in accordance with the charge stored in the storage capacitor 70. Then, a current is fed into the first electrode layer 81 from the power source line 3*e* via the channel of the driving thin film transistor 30*c*, and the current is further fed into the counter electrode via the organic functional layer. As a result, the organic EL device 80 emits light in accordance with the amount of the current passing therethrough.

In the thus configured organic EL apparatus 100, each of the plurality of the pixels 100*a* corresponds to red (R), green (G), or blue (B), and three pixels 100*a* of red (R), green (G), and blue (B) configure a picture element. In this embodiment, the organic EL device 80 emits white light or mixed-color light of red (R), green (G), and blue (B). The color, red (R), green (G), or blue (B), of a pixel 100*a* is defined by a color filter layer described below.

Figure 2A:
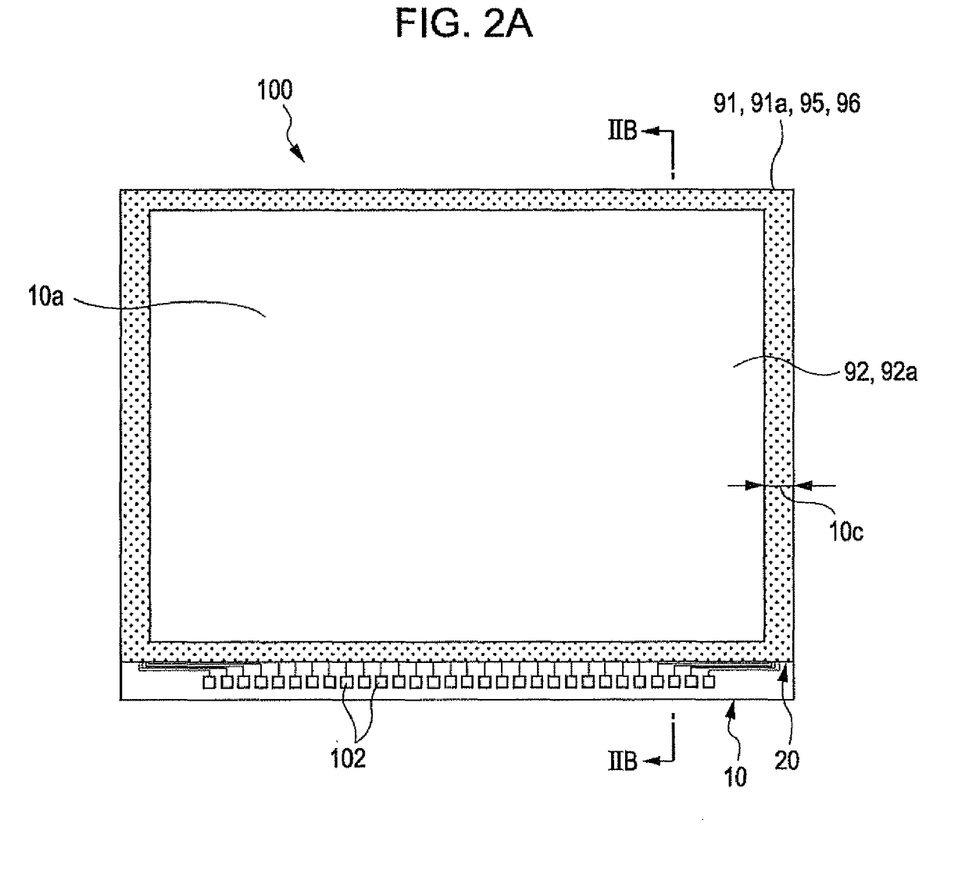
FIG. 2A is a plan view taken from the second substrate side for illustrating the planar structure together with the respective components of the organic EL apparatus applied with the invention.
Figure 2B:
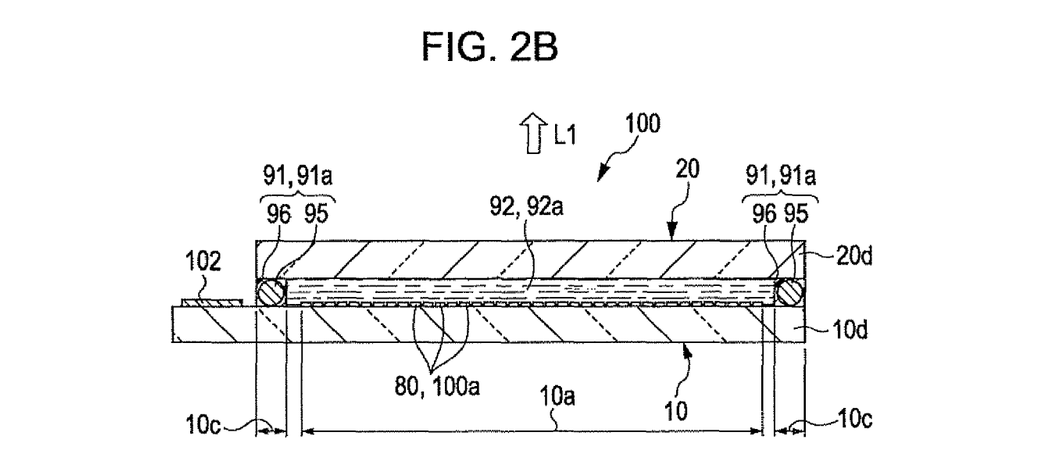
FIG. 2B is a cross-sectional view of the organic EL apparatus taken along the line IIB-IIB in FIG. 2A.

In the structure shown in FIG. 1, the power source lines 3*e* are arranged in parallel to the scanning line 3*a*, but the power source lines 3*e* may be arranged so as to be parallel to the data lines 6*a*. In addition, in the structure shown in FIG. 1, the storage capacitors 70 are configured utilizing the power source lines 3*e*, but the storage capacitors 70 may be configured with capacitor lines formed differently from the power source lines 3*e*. Specific structure of organic EL apparatus FIG. 2A is a plan view taken from the second substrate side for illustrating the planar structure together with the respective components of the organic EL apparatus applied with the invention, and FIG. 2B is a cross-sectional view of the organic EL apparatus taken along the line IIB-IIB in FIG. 2A. In FIG. 2B, color filter layer and other components are not shown in the drawing. In FIGS. 2A and 2B, the organic EL apparatus 100 of this embodiment includes a first substrate 10 functioning as an element substrate and a second substrate 20 functioning as both a sealing substrate and a color filter layer substrate. The first substrate 10 and the second substrate 20 are disposed so as to face each other with a plurality of organic EL devices 80 on the first substrate 10 therebetween. The first substrate 10 and the second substrate 20 are bonded to each other with a first sealing material layer 91 and a second sealing material layer 92. The first sealing material layer 91, which is shown in FIG. 2A as a thickly dotted region, is provided in a frame shape along a peripheral region 10c surrounding the pixel region 10a, while the second sealing material layer 92, which is shown in FIG. 2A as a thinly dotted region, is provided over the entire region surrounded by the first sealing material layer 91. The structures of the first sealing material layer 91 and the second sealing material layer 92 will be described below in detail.

The first substrate 10 is provided with terminals 102 on a region protruding from the second substrate 20. Furthermore, the first substrate 10 is provided with the data line driving circuit 101 and the scanning line driving circuits 104 (not shown), which have been described with reference to FIG. 1, on the peripheral region 10c and the region between the pixel region 10a and the peripheral region 10c.

Structure of Organic EL Device

Figure 3A:
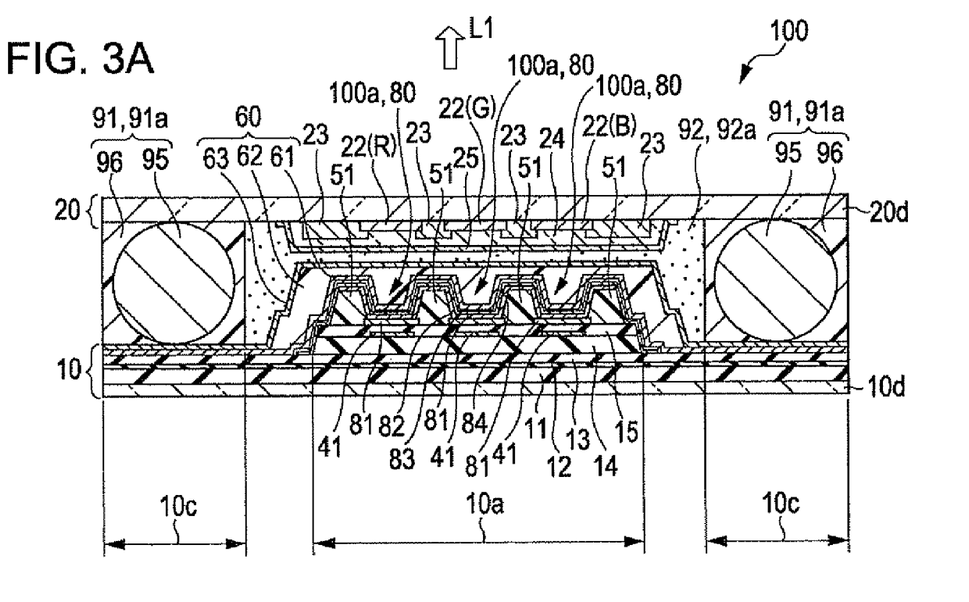
FIG. 3A is a cross-sectional view schematically illustrating the cross-sectional structure of an organic EL apparatus applied with the invention.
Figure 3B:
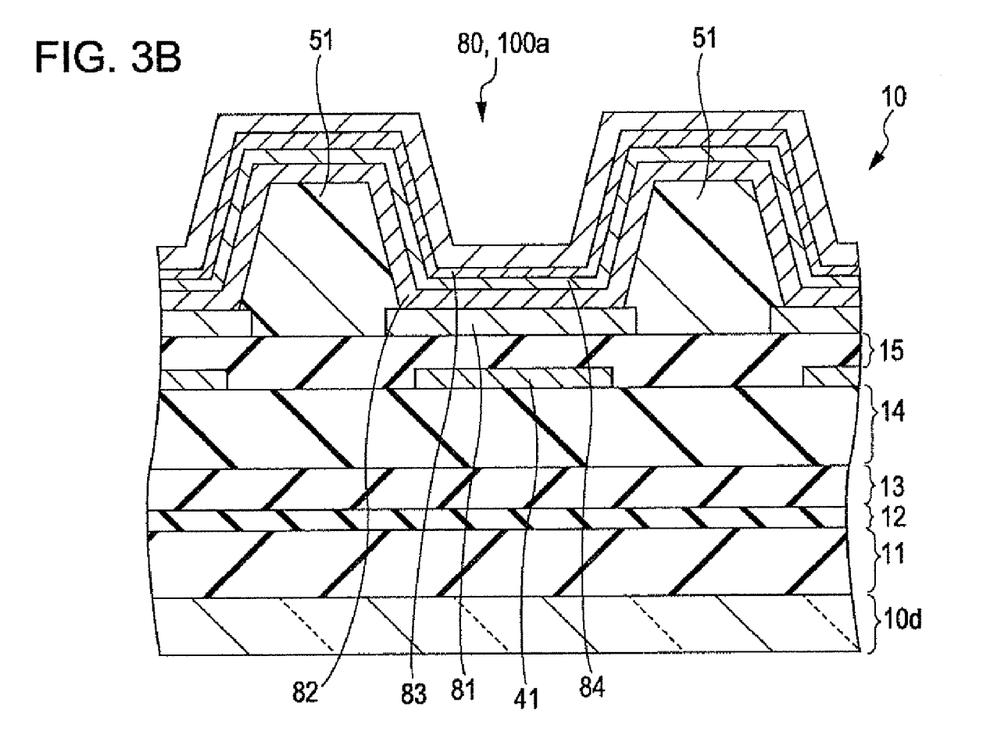
FIG. 3B is an enlarged cross-sectional view schematically illustrating one pixel.

FIG. 3A is a cross-sectional view schematically illustrating the cross-sectional structure of an organic EL apparatus applied with the invention, and FIG. 3B is an enlarged cross-sectional view schematically illustrating one pixel. In FIG. 3A, only three organic EL devices corresponding to red (R), green (G), and blue (B) pixels are shown.

As shown in FIGS. 3A and 3B, the first substrate 10 includes a support substrate 10d such as a quartz substrate, a glass substrate, a ceramic substrate, or a metal substrate. The support substrate 10d is provided with insulating films 11, 12, 13, 14, and 15 on a surface thereof, and the organic EL devices 80 are disposed above the insulating layer 15. In this embodiment, the insulating films 11, 12, 13, and 15 are, for example, a silicon oxide film or a silicon nitride film, and the insulating film 14 is a planarizing film made of a thick photosensitive resin, having a thickness of 1.5 to 2.0 µm. The insulating layer 11 is a base insulating layer. Though they are not shown, the thin film transistors 30b and 30c, the storage capacitor 70, various wiring lines, and driving circuits described with reference to FIG. 1 are disposed, for example, between the insulating films 11, 12, 13, and 14. The electrically conductive films disposed in different interlayer spaces are electrically connected to each other via contact holes provided in the insulating films 12, 13, 14, and 15.

The organic EL apparatus 100 of this embodiment is a top-emission type, and, as shown by the arrow L1, light is drawn from the side where the organic EL devices 80 are disposed in the view from the support substrate 10d. Therefore, the support substrate 10d can be an opaque substrate made of, for example, a ceramic such as alumina or stainless steel. In addition, a light reflection layer 41 made of aluminum, silver, or an alloy thereof is disposed between the insulating films 14 and 15, and light can be emitted by reflecting the light emitted from the organic EL device 80 toward the support substrate 10d with the light reflection layer 41.

In the first substrate 10, translucent first electrode layers 81 (anode/pixel electrode) made of, for example, an ITO film or an IZO film arranged above the insulating film 15 as islands, and thick barriers 51 made of, for example, a photosensitive resin and having openings for defining emission regions are disposed above the first electrode layers 81.

Above the first electrode layers 81, an organic functional layer 82 and a translucent second electrode layer 83 (cathode) are stacked. The first electrode layer 81, the organic functional layer 82, and the second electrode layer 83 defines an organic EL device 80. In this embodiment, the organic functional layer 82 and the second electrode layer 83 are formed over the entire or approximately the entire pixel region 10a including the region where the barriers 51 are disposed. The second electrode layer 83 herein is applied with a constant potential directly or via the cathode wiring.

In this embodiment, the organic functional layer 82 has a structure in which a hole injection layer made of a triarylamine (ATP) multimer, a TPD (triphenyl diamine)-based hole transport layer, an emission layer made of a styryl-based material (host) containing an anthracene-based dopant or a rubrene-based dopant, and an electron injection layer made of aluminum quinolinol ($Alq_3$) are stacked in this order. Furthermore, a second electrode layer 83 made of a metal thin film such as MgAg is disposed above the structure. Furthermore, an electron injection buffer layer made of LiF may be disposed between the organic functional layer 82 and the second electrode layer 83. Among these layers, each layer configuring the organic functional layer 82 and the electron injection buffer layer can be sequentially formed by a vacuum deposition method using a heating boat (crucible). The layer made of a metal material, such as the second electrode layer 83, can be formed by a vacuum deposition method, and the first electrode layer 81 made of an oxide material such as ITO can be formed by ECR plasma sputtering, ion plating using a plasma gun, or high-density plasma chemical vapor deposition such as magnetron sputtering.

In this embodiment, since the organic EL device 80 emits white light or mixed-color light of red (R), green (G), and blue (B), the organic EL apparatus 100 conducts full color display by changing color using RGB color filter layers 22 of red (R), green (G), and blue (B) disposed on the second substrate 20 at positions facing the organic EL devices 80. That is, in the second substrate 20, the RGB color filter layers 22 of red (R), green (G), and blue (B), a light-shielding layer 23 (black matrix layer) for preventing leakage of light from between the RGB color filter layers 22, a translucent planarizing film 24, and a translucent gas barrier layer 25 of, for example, a silicon oxynitride layer are provided, in this order, on a translucent support substrate 20d (translucent substrate) of a plastic substrate made of, for example, polyethylene terephthalate, an acrylic resin, polycarbonate, or polyolefin or a glass substrate. The RGB color filter layers 22 are layers of a transparent resin binder containing a pigment or a dye. Red (R), green (G), and blue (B) are basically used, but light blue, light cyan, white, and other color may be used according to the purpose. Preferably, the thickness of each of the RGB color filter layers 22 is as small as possible in view of light transmittance and is 0.1 to 1.5 µm. The thickness may be different depending on the color of the filter. The light-shielding layer 23 is made of a resin containing a black pigment and has a thickness larger than those of the RGB color filter layers 22, preferably, about 1 to 2 µm, but the thickness may be larger than this range. The second substrate 20 may be further provided with a functional layer such as an ultraviolet blocking/absorbing layer for preventing incidence of ultraviolet, a light reflection-preventing layer, or a heat dissipating layer.

In the thus configured organic EL apparatus 100, the organic functional layer 82, the second electrode layer 83 used as the cathode, and the electron injection layer tend to be degraded by moisture. Such degradation causes a decrease in electron injection effect and an occurrence of a non-emission portion, called a dark spot. Accordingly, in this embodiment, a combination of a structure in which the second substrate 20 bonded to the first substrate 10 functions as a sealing substrate and a structure in which the first substrate 10 is provided with a sealing film 60 described below is employed.

In the first substrate 10, the sealing film 60 is disposed above the second electrode layer 83 over a region broader than the area of the pixel region 10a. The sealing film 60 in this embodiment is a laminate film including a first layer 61 of a silicon compound layer stacked on the second electrode layer 83, a second layer 62 of a resin layer stacked on the first layer 61, and a third layer 63 of a silicon compound stacked on the second layer 62. The first layer 61 and the third layer 63 are made of, for example, silicon nitride ($SiN_x$) or silicon oxynitride ($SiO_xY_y$) and are formed by high-density plasma vapor deposition using a high-density plasma source, such as ion plating using a plasma gun, ECR plasma sputtering, ECR plasma CVD, surface wave plasma CVD, or ICP-CVD. Such a thin film functions as a high-density gas barrier layer that can certainly block moisture even if the thin film is formed at a low temperature. The second layer 62 is made of a resin layer and functions as an organic buffer layer for preventing occurrence of clacking in the first layer 61 and the third layer 63 by planarizing surface asperities caused by the barriers 51, wiring, and other components.

Then, in this embodiment, as shown in FIGS. 2A, 2B, and 3A, the first sealing material layer 91 is formed between the first substrate 10 and the second substrate 20 in a frame shape along the peripheral region 10c, and the translucent second sealing material layer 92 is formed over the entire region surrounded by the peripheral region 10c. The first substrate 10 and the second substrate 20 are bonded to each other with the first sealing material layer 91 and the second sealing material layer 92. In this embodiment, the first sealing material layer 91 is made of an epoxy adhesive 91a that is cured by exposure to ultraviolet light. The second sealing material layer 92 is disposed between the first substrate 10 and the second substrate 20 and has a structure in which a bead-type or fiber-type gap material 95 that controls the distance between the first substrate 10 and the second substrate 20 is dispersed in a resin 96. Thus, the distance between the first substrate 10 and the second substrate 20 is controlled by the gap material 95. The resin 96 used in the second sealing material layer 92 is an epoxy adhesive 92a that is cured by heat.

Structure of Auxiliary Cathode Layer and Main Effect in This Embodiment

Figure 4:
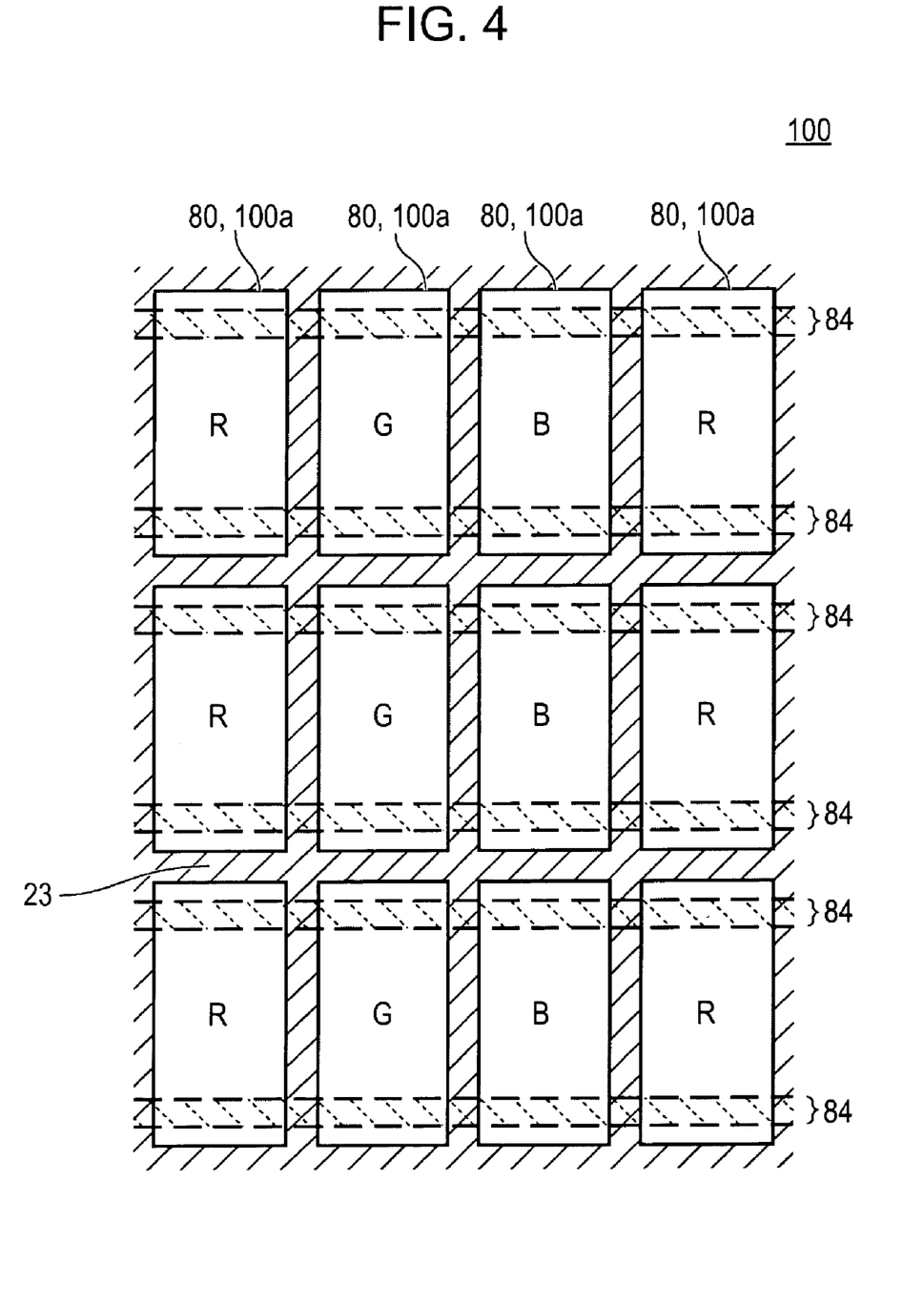
FIG. 4 is a plan view illustrating a positional relationship between the auxiliary wiring layer and the pixels in an organic EL apparatus according to a first embodiment of the invention.

FIG. 4 is a plan view illustrating a positional relationship between the auxiliary wiring layer and the pixels in an organic EL apparatus according to the first embodiment of the invention. In FIG. 4, the auxiliary wiring layer is disposed in the region indicated by dotted lines sloping downward to the right, and the light-shielding layer 23 formed on the second substrate 20 is disposed in the region indicated by lines sloping upward to the right. In FIG. 4, the pixels 100a and the organic EL devices 80 are indicated by rectangles drawn by solid lines.

The thus configured organic EL apparatus 100 is a top-emission type: light emitted from the organic EL device 80 is emitted from the side where the second electrode layer 83 is disposed (the opposite side of the side where the support substrate 10d is disposed). Therefore, the second electrode layer 83 is required to be translucent. Accordingly, the second electrode layer 83 has a small thickness of, for example, less than 10 nm, and therefore the electric resistance of the second electrode layer 83 varies depending on the region. Such variation of the electric resistance causes a variation in brightness.

Accordingly, in this embodiment, an auxiliary wiring layer 84 is disposed on the lower side of the second electrode layer 83 so as to be in contact with the second electrode layer 83. In this embodiment, as shown in FIGS. 3A, 3B, and 4, the auxiliary wiring layer 84 having a stripe-like pattern, in the plan view, overlaps at least part of the light emission region (region where the organic EL device 80 is disposed) of each of the pixels 100a, and two stripes, in parallel to each other, of the auxiliary wiring layer 84 overlap each pixel 100a. The auxiliary wiring layer 84 is not applied with a constant potential and has functions of decreasing electric resistance of the entire second electrode layer 83 and eliminating the variation in the electric resistance, but, in some cases, the auxiliary wiring layer 84 is applied with a constant potential directly or via a cathode wiring line.

Here, the auxiliary wiring layer 84 is formed of a silver layer or a silver alloy layer having an electric conductivity higher than that of aluminum, and has a small thickness, for example, less than 10 nm so that approximately perfect translucency is realized. Therefore, in this embodiment, the amount of emitted light is not largely decreased by forming the auxiliary wiring layer 84 so as to, in the plan view, overlap the pixels 100a. Consequently, it is not necessary to dispose the auxiliary wiring layer 84 between the adjacent pixels 100a, and therefore it is not necessary to save a broad space between the adjacent pixels 100a for disposing the auxiliary wiring layer 84 therein. As a result, the pixels can be increased in size. Furthermore, in the plan view, the auxiliary wiring layer 84 is not required completely overlaps the light-shielding layer 23 provided to the second substrate 20, and therefore the light-shielding layer 23 may have a narrow width. Consequently, according to this embodiment, the ratio of the light emission region occupying in a pixel 100a (pixel aperture ratio) is high. As a result, in the organic EL apparatus 100 of this embodiment, an image with high brightness and high quality can be displayed.

Second Embodiment

Figure 5:
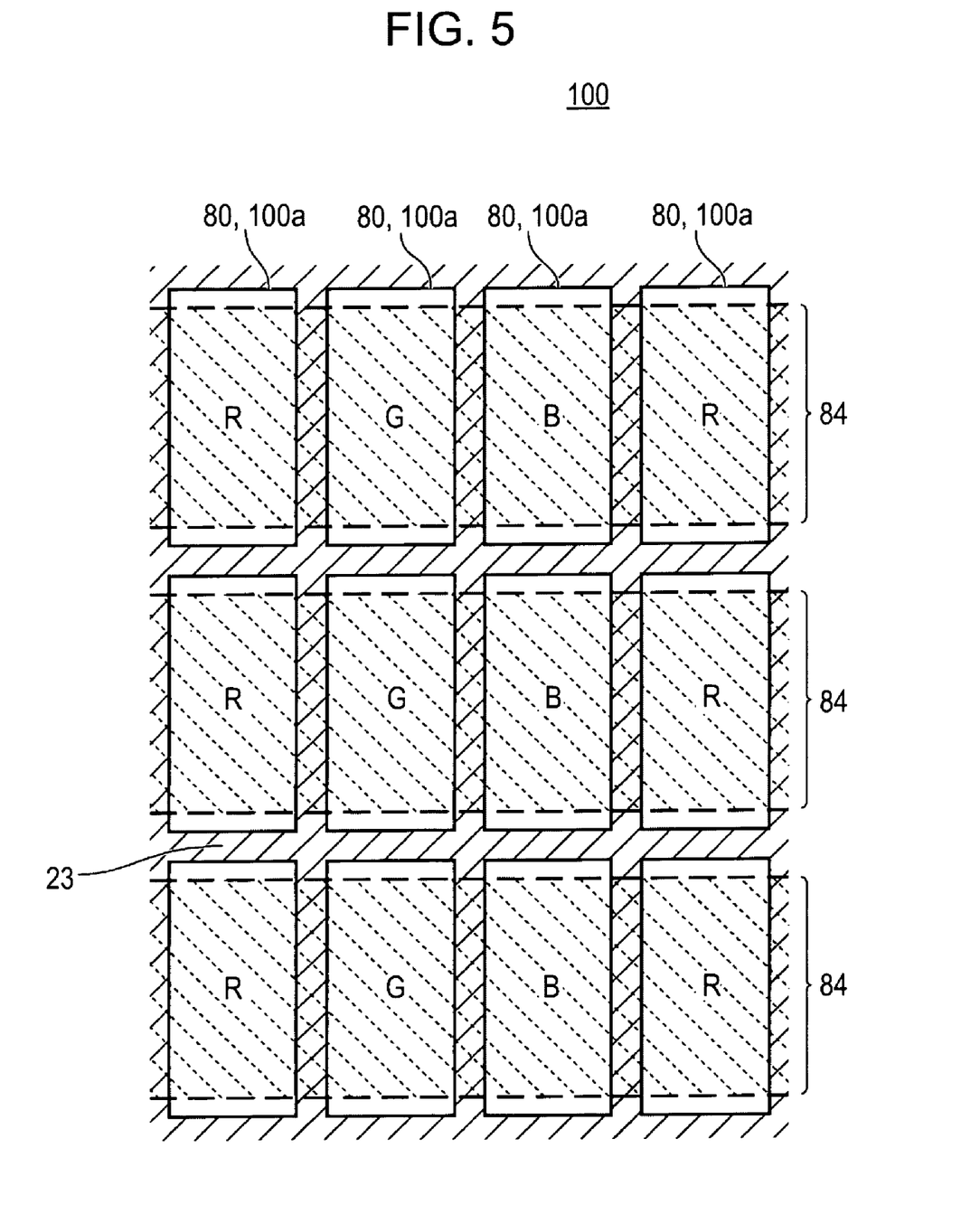
FIG. 5 is a plan view illustrating a positional relationship between the auxiliary wiring layer and the pixels in an organic EL apparatus according to a second embodiment of the invention.

FIG. 5 is a plan view illustrating a positional relationship between the auxiliary wiring layer and the pixels in an organic EL apparatus according to a second embodiment of the invention. Since the basic structure of this embodiment is the same as that of the first embodiment, the same components are designated by the same reference numerals, and the descriptions thereof are omitted. The basic structure of the pixels of the organic EL apparatus of this embodiment will be described with reference to FIGS. 3A and 3B.

Since the organic EL apparatus of this embodiment is also a top-emission type as in the first embodiment, the second electrode layer 83 shown in FIGS. 3A and 3B is required to be translucent. Accordingly, the second electrode layer 83 has a small thickness, and therefore the electric resistance of the second electrode layer 83 varies depending on the region. Such variation of the electric resistance causes a variation in brightness. Therefore, also in this embodiment, an auxiliary wiring layer 84 is disposed on the lower side of the second electrode layer 83 so as to be in contact with the second electrode layer 83, as in the first embodiment. The auxiliary wiring layer 84 is not applied with a constant potential and has functions of decreasing electric resistance of the entire second electrode layer 83 and eliminating the variation in the electric resistance, but, in some cases, the auxiliary wiring layer 84 is applied with a constant potential directly or via a cathode wiring line.

In this embodiment, as shown in FIGS. 3A, 3B, and 5, the auxiliary wiring layer 84 having a stripe-like pattern, in the plan view, overlaps at least part of the light emission region (region where the organic EL device 80 is disposed) of each of the pixels 100a, and the auxiliary wiring layer 84 with a broad width is disposed in each pixel 100a. Here, the auxiliary wiring layer 84 is formed of a silver layer or a silver alloy layer having an electric conductivity higher than that of aluminum. The auxiliary wiring layer 84 has a small thickness so that translucency is realized. Therefore, in this embodiment, the amount of emitted light is not largely decreased by forming the auxiliary wiring layer 84 so as to, in the plan view, overlap the pixels 100a. Consequently, it is not necessary to dispose the auxiliary wiring layer 84 between the adjacent pixels 100a, and therefore it is not necessary to save a broad space between the adjacent pixels 100a for disposing the auxiliary wiring layer 84 therein. As a result, the pixels can be increased in size. Furthermore, in the plan view, the auxiliary wiring layer 84 is not required completely overlaps the light-shielding layer 23 provided to the second substrate 20, and therefore the light-shielding layer 23 may have a narrow width. Consequently, according to this embodiment, the ratio of the light emission region occupying in a pixel 100a (pixel aperture ratio) is high.

Here, the auxiliary wiring layer 84 has a thickness of, for example, about 10 nm which is larger than that in the first embodiment and thereby implements a function as a half mirror layer. Therefore, in this embodiment, an optical resonator is configured using the auxiliary wiring layer 84 (half mirror layer) so that the spectrum of light emitted from the organic EL device 80 is adjusted to the color of the corresponding pixel 100a. In the configuration of the optical resonator, for example, the thickness of the first electrode layer 81 shown in FIGS. 3A and 3B is altered according to the color of the corresponding pixel 100a, or the thickness of the insulating film 15 lying between the first electrode layer 81 and the light reflection layer 41 is altered according to the color of the corresponding pixel 100a. As a result, an optical resonator having an optical length corresponding to the wavelength of the color of the corresponding pixel 100a is formed between the auxiliary wiring layer 84 (half mirror layer) and the light reflection layer 41. Consequently, each pixel 100a emits light adjusted to the corresponding color with the optical resonator and light directly emitted without passing through the auxiliary wiring layer 84. Such light is subjected to color conversion with the corresponding one of the RGB color filter layers 22 and then emitted. As a result, since each pixel 100a emits light excellent in color purity, a color image having high quality can be displayed.

Third Embodiment

Figure 6:
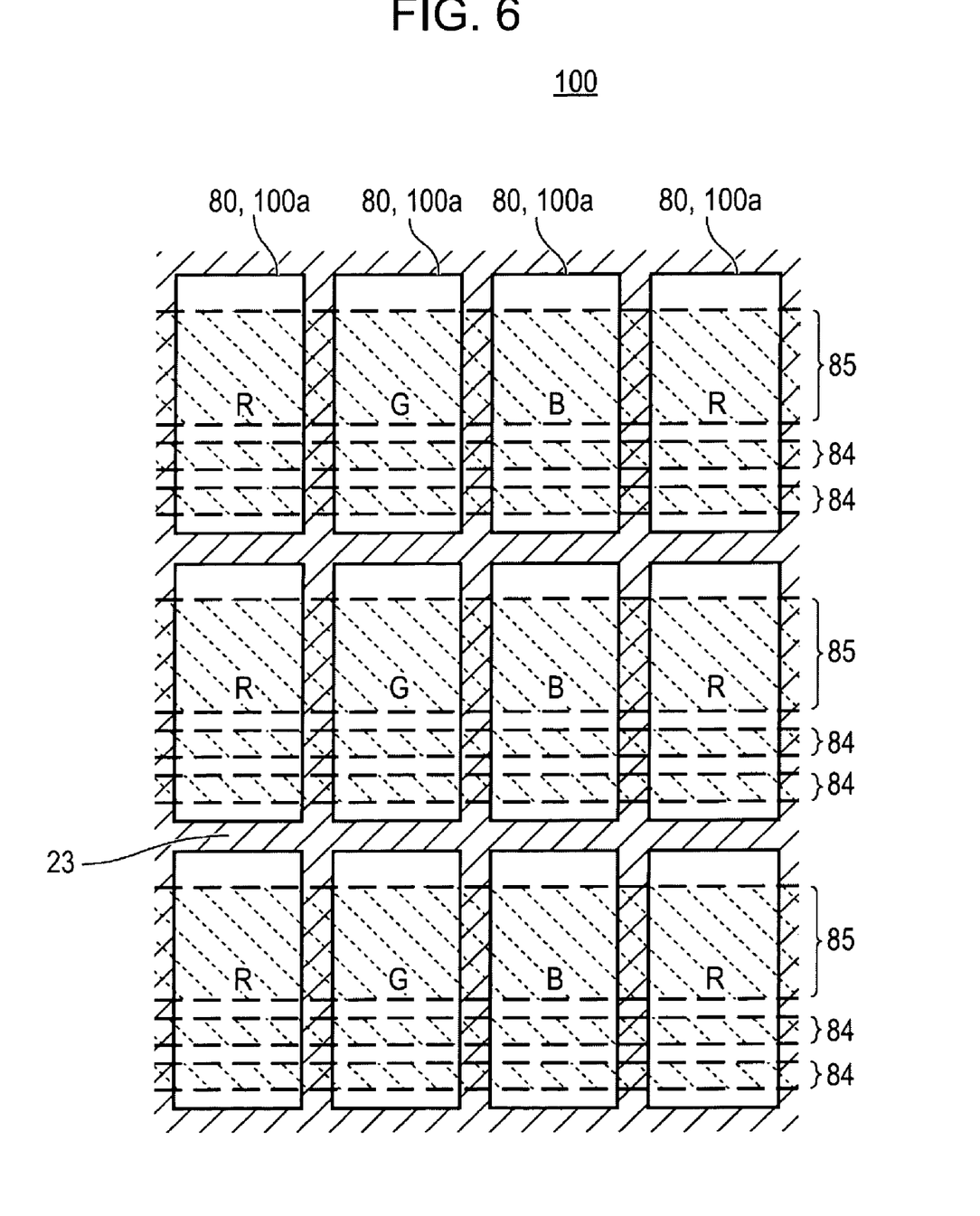
FIG. 6 is a plan view illustrating a positional relationship between the auxiliary wiring layer and the pixels in an organic EL apparatus according to a third embodiment of the invention.

FIG. 6 is a plan view illustrating a positional relationship between the auxiliary wiring layer and the pixels in an organic EL apparatus according to a third embodiment of the invention. Since the basic structure of this embodiment is the same as those of the first and second embodiments, the same components are designated by the same reference numerals, and the descriptions thereof are omitted. The basic structure of the pixels of the organic EL apparatus of this embodiment will be described with reference to FIGS. 3A and 3B.

Since the organic EL apparatus of this embodiment is also a top-emission type as in the first and second embodiments, the second electrode layer 83 shown in FIGS. 3A and 3B is required to be translucent. Accordingly, the second electrode layer 83 has a small thickness, and therefore the electric resistance of the second electrode layer 83 varies depending on the region. Such variation of the electric resistance causes a variation in brightness. Therefore, also in this embodiment, an auxiliary wiring layer 84 is disposed on the lower side of the second electrode layer 83 so as to be in contact with the second electrode layer 83, as in the first embodiment. The auxiliary wiring layer 84 is not applied with a constant potential and has functions of decreasing electric resistance of the entire second electrode layer 83 and eliminating the variation in the electric resistance, but, in some cases, the auxiliary wiring layer 84 is applied with a constant potential directly or via a cathode wiring line.

In this embodiment, as shown in FIGS. 3A, 3B, and 6, the auxiliary wiring layer 84 having a stripe-like pattern, in the plan view, overlaps at least part of the light emission region (region where the organic EL device 80 is disposed) of each of the pixels 100a, and two stripes of the auxiliary wiring layers 84 are disposed in each pixel 100a so as to be adjacent and in parallel to each other. Here, the auxiliary wiring layer 84 is formed of a silver layer or a silver alloy layer having an electric conductivity higher than that of aluminum and has a small thickness, for example, less than 10 nm so that approximately perfect translucency is realized.

In this embodiment, a half mirror layer 85 is disposed at the same interlayer as that the auxiliary wiring layer 84 lies (between the organic functional layer 82 and the second electrode layer 83). Here, the half mirror layer 85 having a stripe-like pattern, in the plan view, overlaps at least part of the light emission region (region where the organic EL device 80 is disposed) of each of the pixels 100a, and is disposed such that the stripe thereof is parallel to the stripe of the auxiliary wiring layer 84 in each pixel 100a. Here, the half mirror layer 85 is formed of a metal layer having a high electric conductivity, such as aluminum, an aluminum alloy, silver, or a silver alloy, and has a small thickness, for example, about 10 nm so that a translucency of about several tens percents is realized.

In this embodiment, the half mirror layer 85 configures an optical resonator having an optical length corresponding to the wavelength of the color of the corresponding pixel 100a between the half mirror layer 85 and the auxiliary wiring layer 84 shown in FIGS. 3A and 3B. That is, the thickness of the first electrode layer 81 or the thickness of the insulating film 15 lying between the first electrode layer 81 and the light reflection layer 41, shown in FIGS. 3A and 3B, is different according to the color of the corresponding pixel 100a. Consequently, each pixel 100a emits light adjusted to the corresponding color with the optical resonator and light directly emitted without passing through the half mirror layer 85. Such light is subjected to color conversion with the corresponding one of the RGB color filter layers 22 and then emitted. As a result, since each pixel 100a emits light excellent in color purity, a color image having high quality can be displayed.

The half mirror layer 85 is formed of a metal layer having a high electric conductivity, such as aluminum, an aluminum alloy, silver, or a silver alloy and thereby has the same functions as those of the auxiliary wiring layer 84, such that the half mirror layer 85 is not applied with a constant potential and has functions of decreasing electric resistance of the entire second electrode layer 83 and eliminating the variation in the electric resistance and also is applied with a constant potential directly or via a cathode wiring line. Accordingly, in this embodiment, the half mirror layer 85 and the auxiliary wiring layer 84 can effectively achieve a decrease of electric resistance of the entire second electrode layer 83 and an elimination of variation in the electric resistance.

Fourth Embodiment

Figure 7:
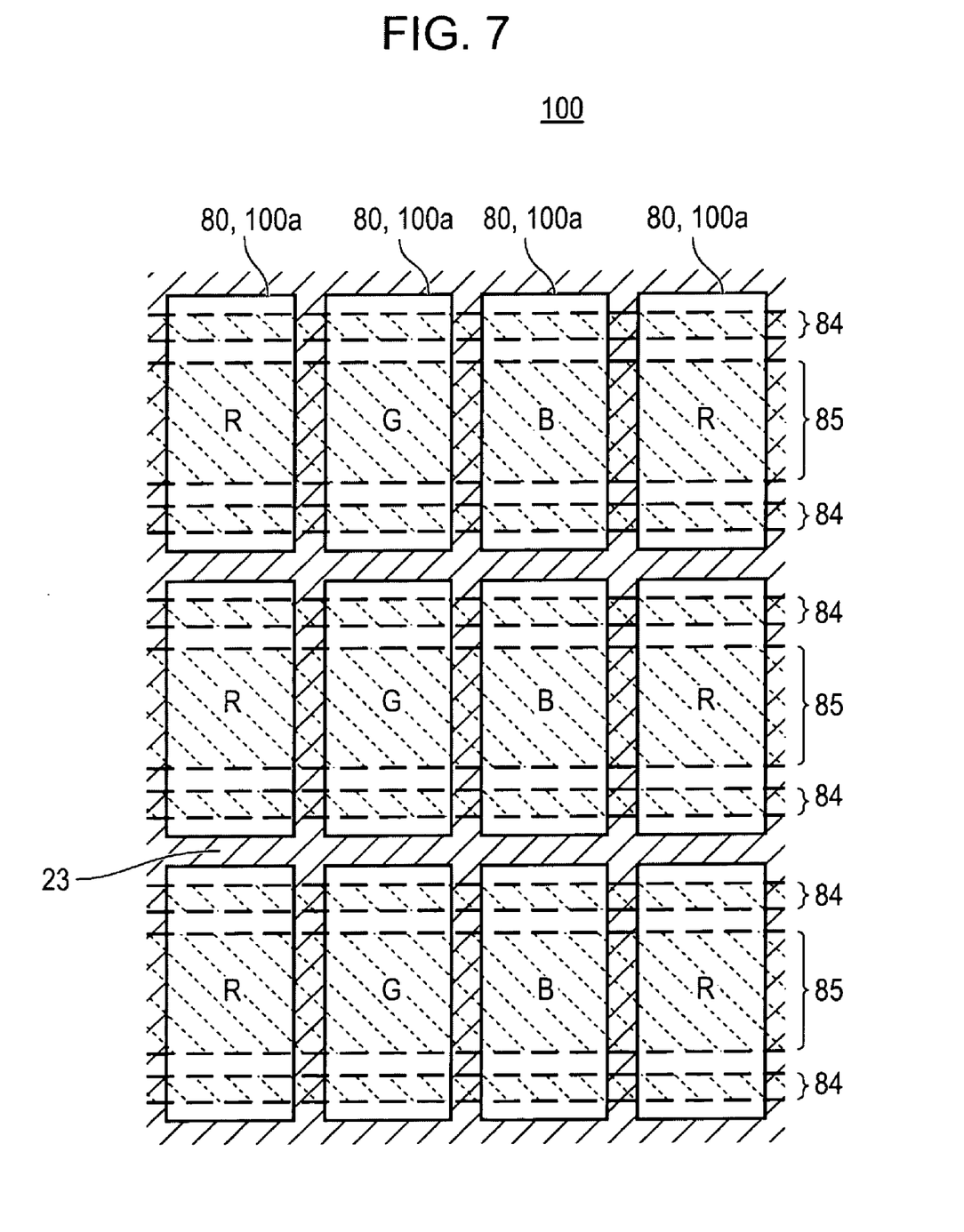
FIG. 7 is a plan view illustrating a positional relationship between the auxiliary wiring layer and the pixels in an organic EL apparatus according to a fourth embodiment of the invention.

FIG. 7 is a plan view illustrating a positional relationship between the auxiliary wiring layer and the pixels in an organic EL apparatus according to a fourth embodiment of the invention. Since the basic structure of this embodiment is the same as those of the third embodiment, the same components are designated by the same reference numerals, and the descriptions thereof are omitted. The basic structure of the pixels of the organic EL apparatus of this embodiment will be described with reference to FIGS. 3A and 3B.

As shown in FIG. 7, also in this embodiment, an auxiliary wiring layer 84 having approximately perfect translucency and a half mirror layer 85 having a translucency of about several tens percents run in each of the plurality of the pixels 100a, as in the third embodiment. In the configuration of the third embodiment, two stripes of the auxiliary wiring layer 84 are disposed on one end side of the pixel 100a in parallel to each other, and the half mirror layer 85 is disposed on the other end side in parallel to the auxiliary wiring layer 84. However, the positional relationship between them is not limited, and, as shown in FIG. 7, the half mirror layer 85 may be disposed between the two stripes of the auxiliary wiring layer 84.

Fifth Embodiment

Figure 8:
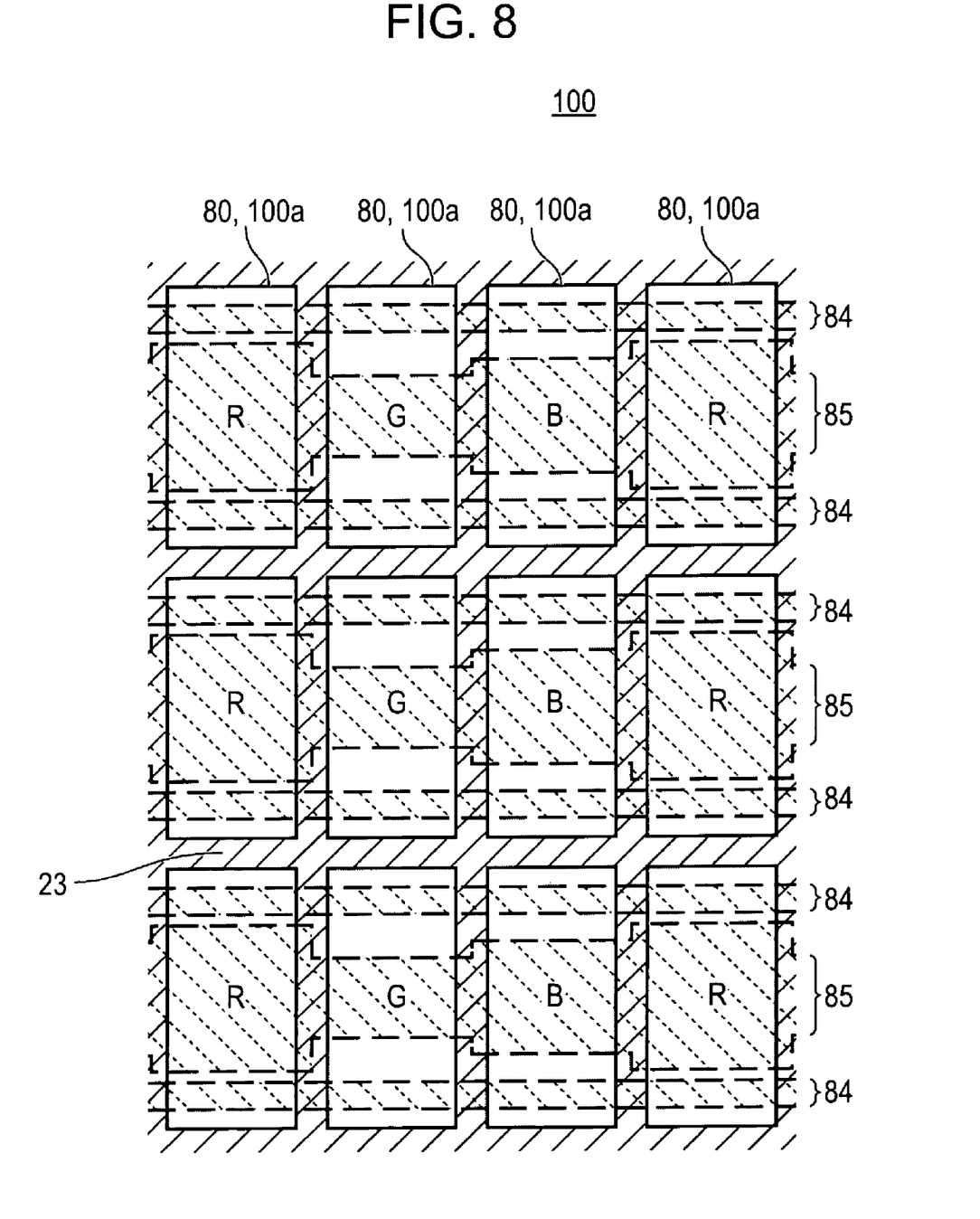
FIG. 8 is a plan view illustrating a positional relationship between the auxiliary wiring layer and the pixels in an organic EL apparatus according to a fifth embodiment of the invention.

FIG. 8 is a plan view illustrating a positional relationship between the auxiliary wiring layer and the pixels in an organic EL apparatus according to a fifth embodiment of the invention. Since the basic structure of this embodiment is the same as those of the third embodiment, the same components are designated by the same reference numerals, and the descriptions thereof are omitted. The basic structure of the pixels of the organic EL apparatus of this embodiment will be described with reference to FIGS. 3A and 3B.

As shown in FIG. 8, also in this embodiment, an auxiliary wiring layer 84 having approximately perfect translucency and a half mirror layer 85 having a translucency of about several tens percents run in each of the plurality of the pixels 100a, as in the third embodiment. In the configuration of the third embodiment, the areas where the half mirror layer 85 overlaps the pixels 100a are, in the plan view, the same in each of the pixels 100a. In this embodiment, the width of the half mirror layer 85 changes depending on the color of the corresponding pixel 100a. The areas where the half mirror layer 85 overlaps each of the pixels 100a are set, in consideration of color conversion characteristics of the RGB color filter layers 22, emission characteristics of the organic EL device 80, visibility among the different colors, and other characteristics, so as to satisfy the following relationship:

pixel 100a (G)<pixel 100a (B)<pixel 100a (R).

Consequently, according to this embodiment, a color image with high quality can be displayed.

Other Embodiments

In the embodiments above, the auxiliary wiring layer 84 and the half mirror layer 85 are disposed on the lower side of the second electrode layer 83, but they may be disposed on the upper side of the second electrode layer 83. In the embodiments above, the auxiliary wiring layer 84 and the half mirror layer 85 are disposed in the same interlayer, but one of the auxiliary wiring layer 84 and the half mirror layer 85 is disposed on the lower side of the second electrode layer 83, and the other may be disposed on the upper side of the second electrode layer 83.

In the embodiments above, the auxiliary wiring layer 84 and the half mirror layer 85 have a stripe-like pattern, but they may have a grid-like pattern. Furthermore, one of the auxiliary wiring layer 84 and the half mirror layer 85 may has a stripe-like pattern, and the other may have a grid-like pattern.

In the embodiments above, the invention is described using top-emission organic EL apparatuses 100 whose second substrates 20 are provided with RGB color filter layers 22, but the invention may be applied to an organic EL apparatus whose organic EL device itself emits light of each color. In this case, the second substrate 20 functions as only a sealing substrate.

In the embodiments above, the invention is described using organic EL apparatuses 100 for color display, but the invention may be applied to an organic EL apparatus for monochrome display, for example, when the apparatus is used as an optical head of a copier, which requires only monochrome display. Also in this case, the second substrate 20 functions as only a sealing substrate.

In the embodiments above, the invention is described using examples that the organic functional layer 82 is formed over the entire pixel region 10a, but the invention may be applied to an organic EL apparatus having an organic functional layer composed of a hole injection layer made of, for example, 3,4-polyethylenedioxythiophene/polystyrenesulfonate (PEDOT/PSS) and an emission layer disposed on the first electrode layer 81, where the organic functional layer is formed by selective application to a region surrounded by the barrier 51 by, for example, an ink jet method and then fixation of them. In this case, the emission layer is made of, for example, a polyfluorene derivative, a polyphenylene derivative, a polyvinyl carbazole derivative, a polythiophene derivative, or these polymer materials doped with a perylene dye, a coumarin dye, or a rhodamine dye, such as rubrene, perylene, 9,10-diphenylanthracene, tetraphenylbutadiene, Nile red, coumarin 6, or quinacridone. The emission layer is preferably made of a π-conjugated polymer, which is an electrically conductive polymer whose π electron of the double bond is delocalized on a polymer chain and is therefore excellent in emission performance. In particular, a compound having a fluorene skeleton, i.e., a polyfluorene compound, is more preferred. In addition, other than these materials, a composition of a precursor of a conjugated polymer organic compound and at least one fluorescent dye for changing emission characteristics can be used.

Examples of Application to Electronic Apparatuses

Figure 9A:
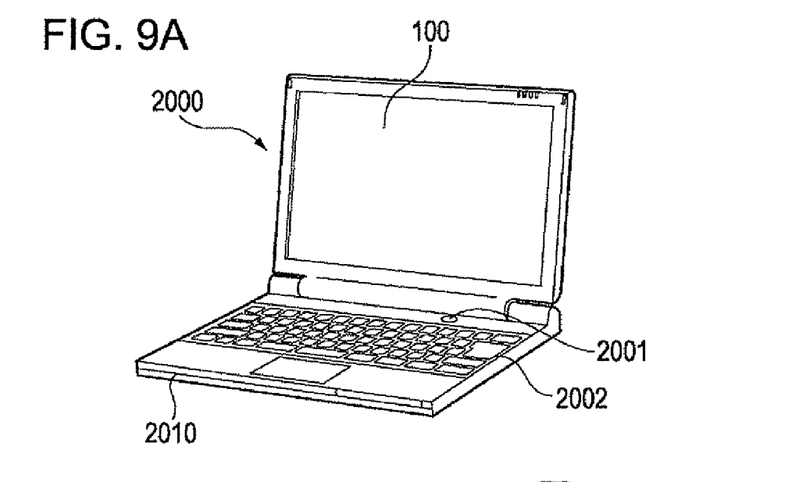
FIG. 9A is an explanatory diagram of an electronic apparatus having the organic EL apparatus according to the invention.
Figure 9B:
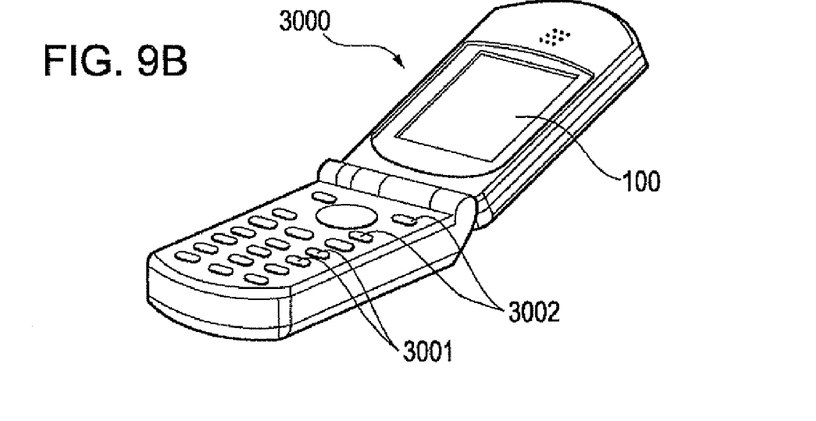
FIG. 9B is an explanatory diagram of an electronic apparatus having the organic EL apparatus according to the invention.
Figure 9C:
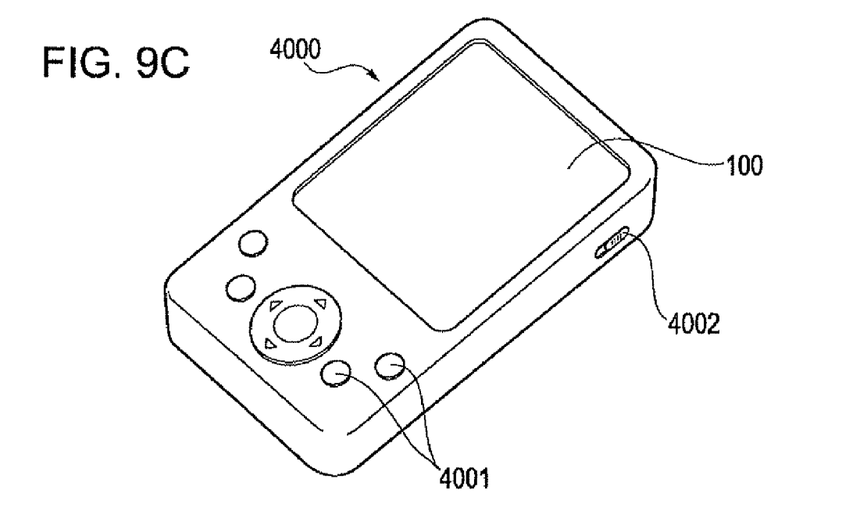
FIG. 9C is an explanatory diagram of an electronic apparatus having the organic EL apparatus according to the invention.

With reference to FIGS. 9A, 9B, and 9C, electronic apparatuses to which the organic EL apparatuses 100 according to the above-described embodiments are applied will be described. FIGS. 9A, 9B, and 9C are explanatory diagrams of electronic apparatuses having the organic EL apparatuses according to the invention.

FIG. 9A shows a structure of a mobile personal computer having the organic EL apparatus 100. The personal computer 2000 includes the organic EL apparatus 100 as a display unit and a main body 2010. The main body 2010 has a power switch 2001 and a keyboard 2002. FIG. 9B shows a structure of a mobile phone having the organic EL apparatus 100. The mobile phone 3000 includes a plurality of operation buttons 3001, scroll buttons 3002, and the organic EL apparatus 100 as a display unit. The image displayed on the organic EL apparatus 100 is scrolled by operating the scroll buttons 3002. FIG. 9C shows a structure of a hand held terminal (PDA: personal digital assistant) having the organic EL apparatus 100. The hand held terminal 4000 includes a plurality of operation buttons 4001, a power switch 4002, and the organic EL apparatus 100 as a display unit. Various types of information, such as an address list and schedules, are displayed on the organic EL apparatus 100 by operating the power switch 4002. Examples of electronic apparatuses to which the organic EL apparatuses 100 are applied include, in addition to those shown in FIGS. 9A, 9B, and 9C, a digital still camera, a liquid-crystal television, viewfinder and monitor-direct-view-type videotape recorders, a vehicle navigation device, a pager, an electronic diary, a portable calculator, a word processor, a workstation, a television phone, a POS terminal, and apparatuses equipped with touch panels. The above-described organic EL apparatuses 100 can be applied to these various electronic apparatuses as displays.

The entire disclosure of Japanese Patent Application No. 2008-105409, filed Apr. 15, 2008 is expressly incorporated by reference herein.

What is claimed is:

1. An organic electroluminescence apparatus comprising:
   a substrate having a pixel region;
   a plurality of pixels, aligned along a first direction in plan view, in the pixel region;
   each of the plurality of pixels including a first electrode layer, a second electrode layer having a translucency and an emission layer disposed between the first electrode and the second electrode, wherein a thickness of the second electrode is smaller than a thickness of the first electrode in a light transmitting direction;
   a wiring layer disposed on the upper side or the lower side of the second electrode, the wiring layer extending continuously over the plurality of pixels in the first direction and having a translucency, wherein
   the wiring layer overlaps the first electrode in plan view, a width of the wiring layer is smaller than a width of the first electrode in a second direction intersecting the first direction, in plan view.

2. The organic electroluminescence apparatus according to claim 1, wherein the wiring layer is formed of a silver layer or a silver alloy layer.

3. The organic electroluminescence apparatus according to claim 1, further comprising:
   a translucent substrate disposed so as to face a surface of the substrate having the pixel region.

4. The organic electroluminescence apparatus according to claim 3, wherein the translucent substrate is provided with a light-shielding layer having a stripe-like pattern or a grid-like pattern in a region, in the plan view, between the adjacent pixels.

5. The organic electroluminescence apparatus according to claim 3, wherein the translucent substrate is provided with color filters having different colors in the region, in the plan view, overlapping the plurality of the pixels.

6. The organic electroluminescence apparatus according to claim 1, wherein the plurality of the organic electroluminescence devices emit light having different colors.

7. The organic electroluminescence apparatus according to claim 5, wherein the wiring layer configures a half mirror layer that configures an optical resonator between the half mirror layer and a light reflection face arranged on the substrate side with respect to the wiring layer.

8. The organic electroluminescence apparatus according to claim 5, wherein
   a half mirror layer of a metal layer is disposed on the upper side or the lower side of the second electrode so as to be in contact with the second electrode; and
   the half mirror layer, in the plan view, overlaps at least part of the organic electroluminescence device in each of the plurality of the pixels and configures an optical resonator between the half mirror layer and a light reflection face arranged on the substrate side with respect to the half mirror layer.

9. The organic electroluminescence apparatus according to claim 8, wherein the half mirror layer is formed of a silver layer, a silver alloy layer, an aluminum layer, or an aluminum alloy layer.

10. The organic electroluminescence apparatus according to claim 5, wherein the areas where the half mirror layer, in the plan view, overlaps the organic electroluminescence devices differ from each other according to the color at the corresponding pixel.

11. The organic electroluminescence apparatus according to claim 1, wherein the wiring layer includes a plurality of strip portions parallel to each other.

12. An organic electroluminescence apparatus comprising:
    a substrate having a pixel region;
    a plurality of pixels, aligned along a first direction in plan view, in the pixel region;
    each of the plurality of pixels including a first electrode layer, a second electrode layer having a translucency and an emission layer disposed between the first electrode and the second electrode;
    a wiring layer, including a plurality of strip portions parallel to each other, disposed on the upper side or the lower side of the second electrode, the wiring layer extending continuously over the plurality of pixels in the first direction and having a translucency, wherein
    the wiring layer overlaps the first electrode in plan view, a width of the wiring layer is smaller than a width of the first electrode in a second direction intersecting the first direction, in plan view.

* * * * *